United States Patent
Baek et al.

(10) Patent No.: US 10,461,970 B2
(45) Date of Patent: Oct. 29, 2019

(54) TRANSMITTER AND RECEIVER FOR SUPPORTING FTN SIGNALING AND METHOD FOR SAME

(71) Applicant: Electronics and Telecommunications Research Institute, Daejeon (KR)

(72) Inventors: Myung Sun Baek, Daejeon (KR); Young Su Kim, Daejeon (KR); Nam Ho Hur, Sejong-si (KR); Hyoung Soo Lim, Daejeon (KR); Heung Mook Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 15/887,300

(22) Filed: Feb. 2, 2018

(65) Prior Publication Data

US 2018/0351771 A1    Dec. 6, 2018

(30) Foreign Application Priority Data

Jun. 5, 2017    (KR) .................. 10-2017-0069791

(51) Int. Cl.
*H04L 25/06* (2006.01)
*H04L 27/26* (2006.01)
(Continued)

(52) U.S. Cl.
CPC ......... *H04L 25/068* (2013.01); *H03F 1/3241* (2013.01); *H04B 1/0475* (2013.01); *H04B 10/5561* (2013.01); *H04L 1/0047* (2013.01); *H04L 25/03343* (2013.01); *H04L 25/03834* (2013.01); *H04L 25/497* (2013.01); *H04L 27/2627* (2013.01); *H04L 27/2615* (2013.01)

(58) Field of Classification Search
CPC .................................................... H04B 1/0475
See application file for complete search history.

(56) References Cited

U.S. PATENT DOCUMENTS 8,514,966 B2    8/2013  Wajcer et al.
2006/0262714 A1*  11/2006  Tarokh ................. H04L 1/0618
                                                          370/208

(Continued)

OTHER PUBLICATIONS

Baek, Myung-Sun, et al. "Joint Masking and PAPR Reduction For Digital Broadcasting System With Faster-Than-Nyquist Signaling." Broadband Multimedia System and Broadcasting (BMSB), *2017 IEEE International Symposium on.* IEEE, 2017. (2 pages, in English).

*Primary Examiner* — Shuwang Liu
*Assistant Examiner* — Gina M McKie
(74) *Attorney, Agent, or Firm* — NSIP Law

(57) ABSTRACT

A transmitter/receiver for supporting FTN (Faster-than-Nyquist) signaling and a method for the same may be provided. The transmitter for supporting FTN signaling) according to an embodiment of the present disclosure includes a frame input unit providing an input frame obtained by composing a transmission signal in units of a frame; a sequence frame determination unit generating a plurality of scramble sequences, generating a plurality of sequence frames by applying the plurality of scramble sequences to the input frame, and determining at least one sequence frame from the plurality of sequence frames considering a PAPR value of the plurality of sequence frames; and a signal transmission unit for transmitting the sequence frame determined.

18 Claims, 9 Drawing Sheets

(51) Int. Cl.
*H04L 25/03* (2006.01)
*H04L 25/497* (2006.01)
*H03F 1/32* (2006.01)
*H04B 1/04* (2006.01)
*H04L 1/00* (2006.01)
*H04B 10/556* (2013.01)

(56) References Cited

U.S. PATENT DOCUMENTS

| | | |
|---|---|---|
| 2011/0188550 A1* | 8/2011 | Wajcer .............. H04L 25/03343 375/214 |
| 2015/0078279 A1 | 3/2015 | Ko et al. |
| 2015/0264551 A1 | 9/2015 | Ko et al. |
| 2016/0269049 A1* | 9/2016 | Kim ..................... H04L 1/0057 |
| 2017/0207934 A1* | 7/2017 | Iyer Seshadri ... H04L 25/03834 |

\* cited by examiner

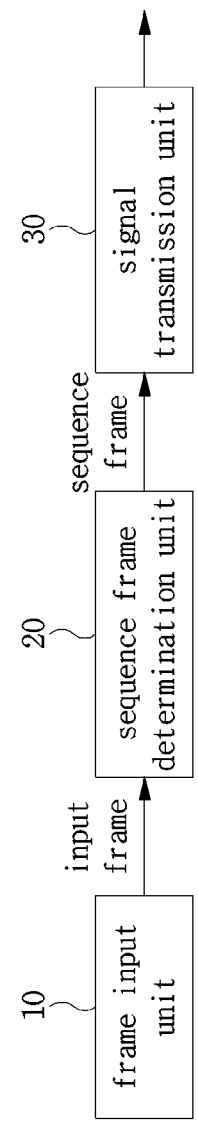
[FIG. 1]

[FIG. 2]
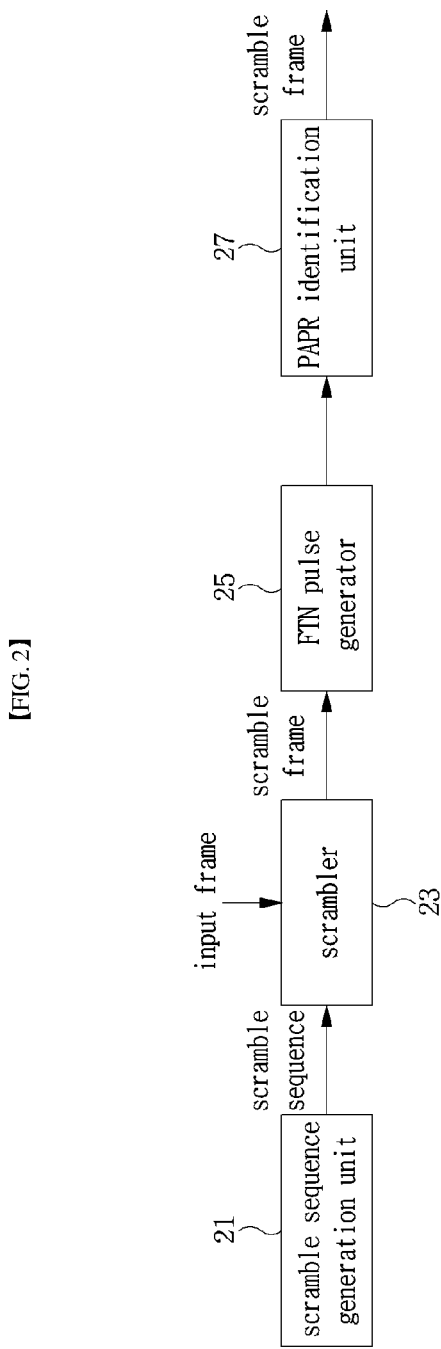

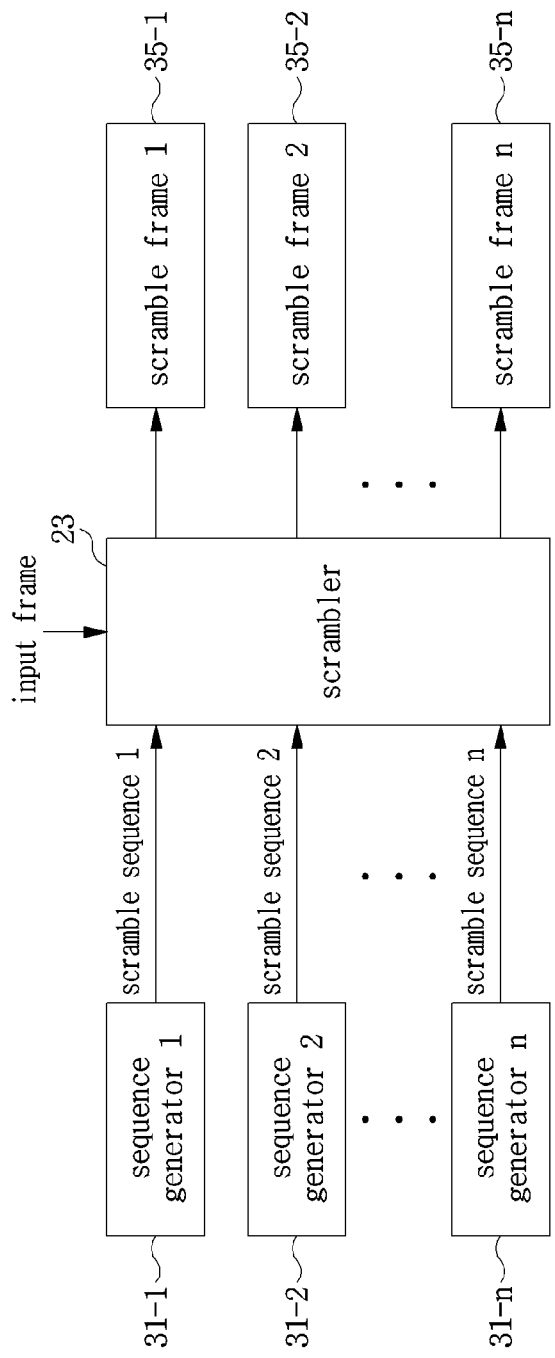
[FIG. 3]

[FIG. 4A]
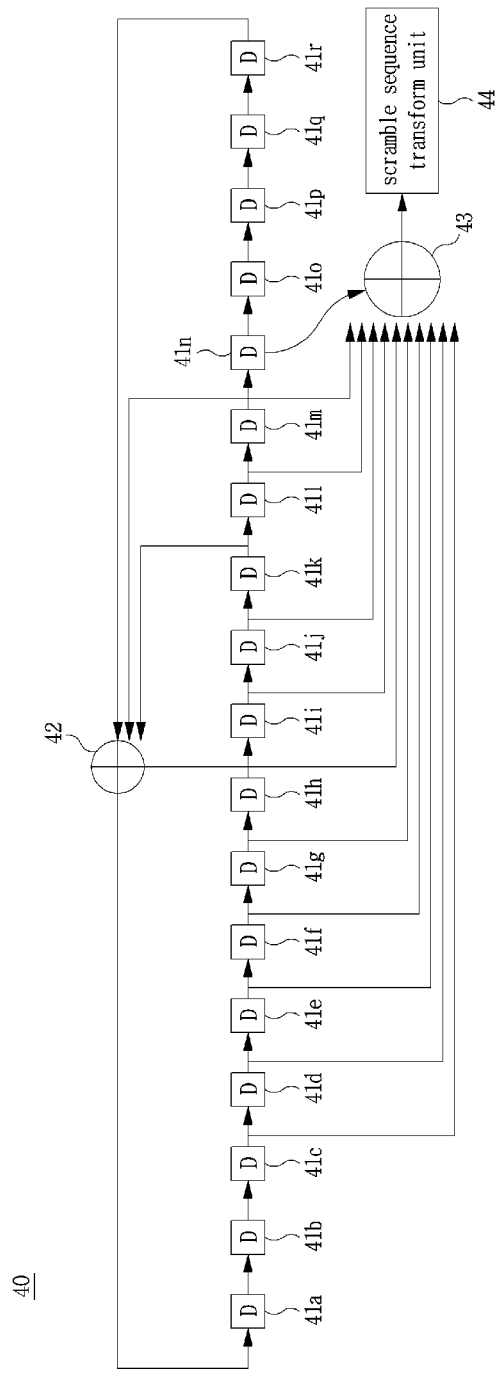

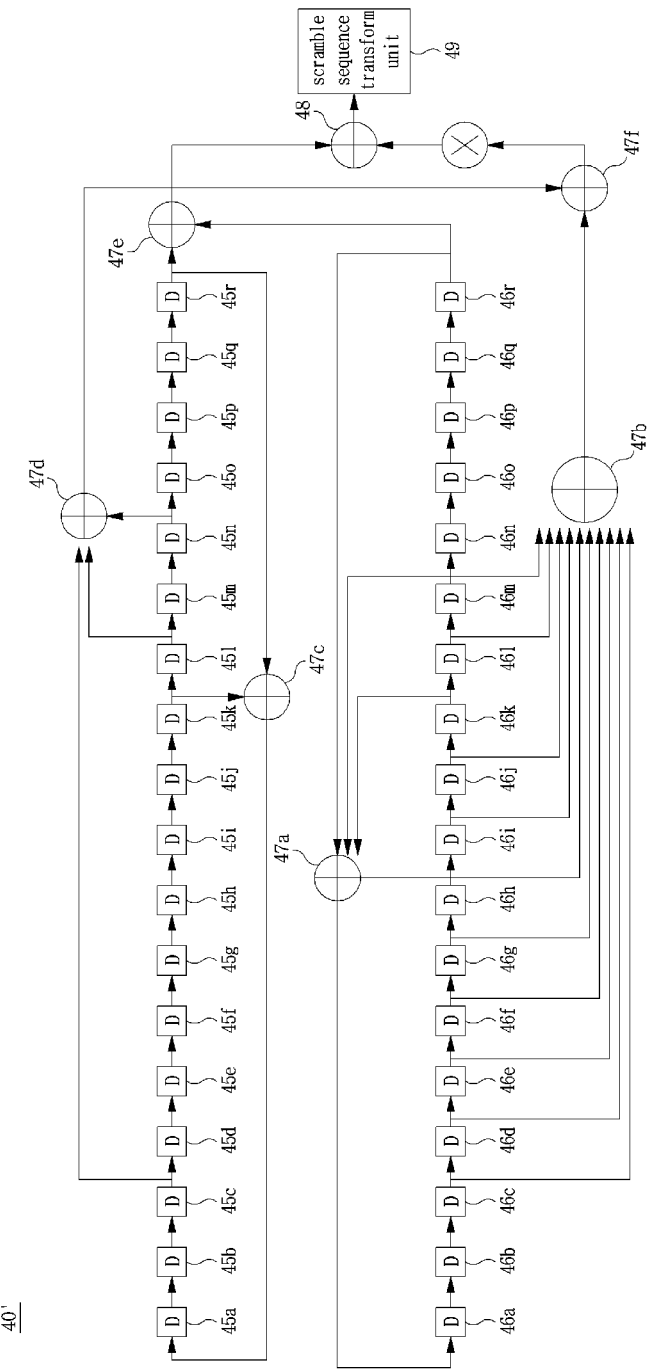
[FIG. 4B]

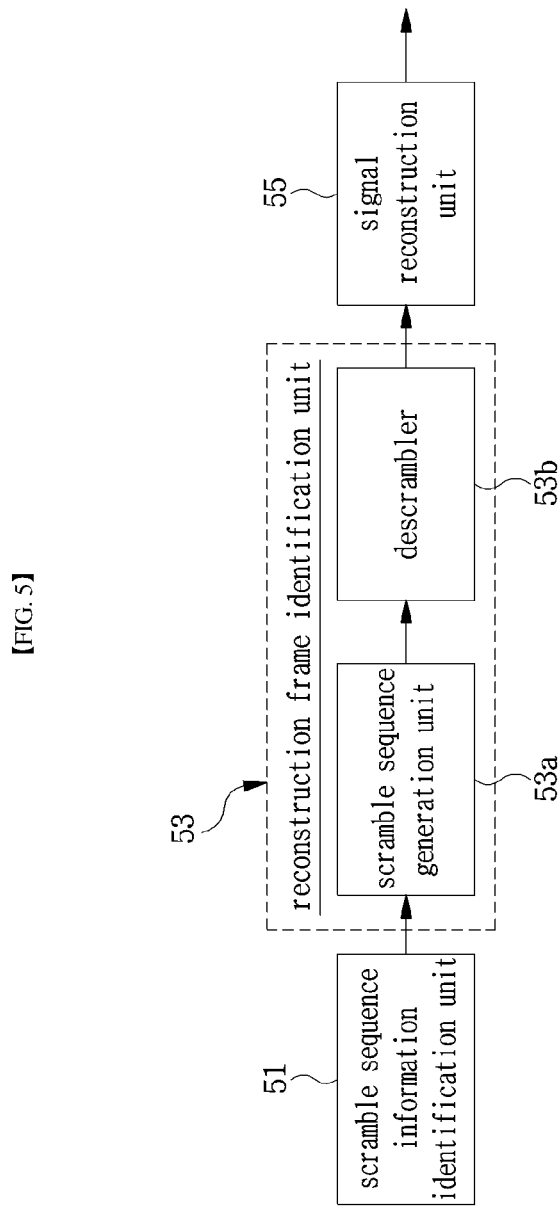

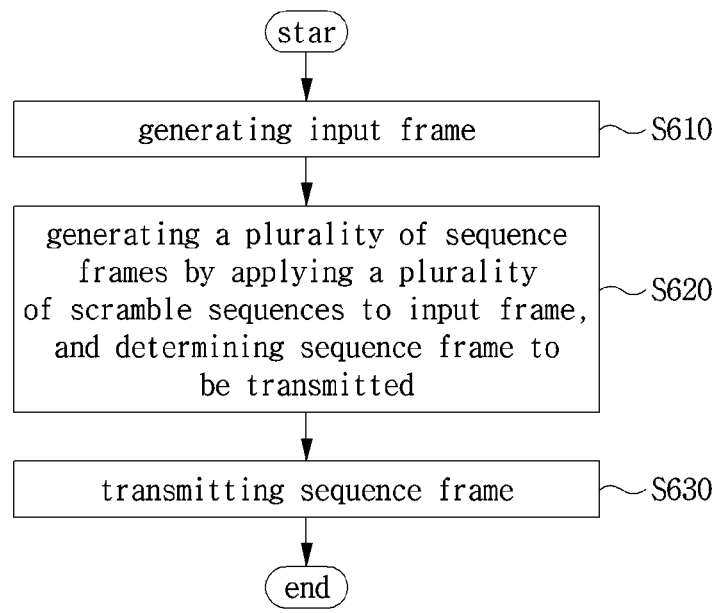
[FIG. 6]

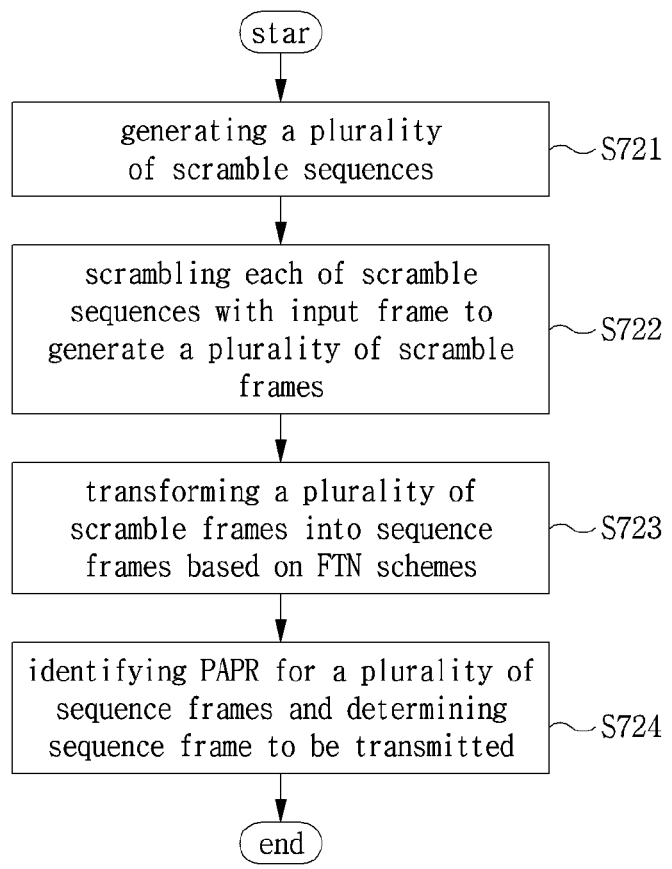
[FIG. 7]

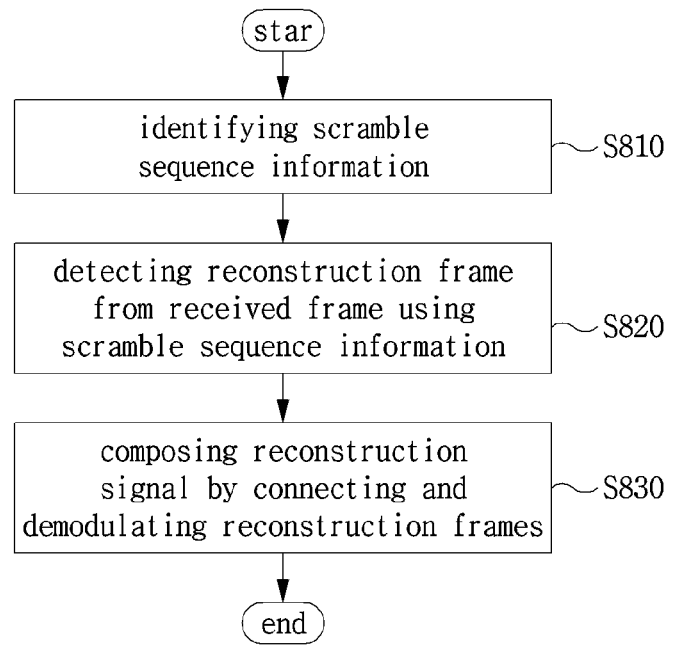

TRANSMITTER AND RECEIVER FOR SUPPORTING FTN SIGNALING AND METHOD FOR SAME

CROSS REFERENCE TO RELATED APPLICATION

The present application claims priority to Korean Patent Application No. 10-2017-0069791, filed Jun. 5, 2017, the entire contents of which is incorporated herein for all purposes by this reference.

BACKGROUND OF THE INVENTION

Field of the Invention

The present disclosure relates generally to a wireless communication system and, more particularly, to a transceiver apparatus for supporting FTN (Faster-than-Nyquist) signaling and a method for the same.

Description of the Related Art

Modulation schemes such as Quadrature Amplitude Modulation (QAM), Frequency Shift Keying (FSK), and Phase Shift Keying (PSK) are used in consideration of the stability and complexity of a wireless communication system. According to such conventional modulation schemes, entities involved in communication transmit and receive information by differentiating the size, frequency, phase, etc. of a symbol in a time domain or a spatial domain of a signal. When the channel gain is good, various interferences are small, or large transmission power is used, the distance between effective symbols becomes large at a receiving end, whereby the transmission rate can be increased by using high-order modulation schemes.

However, when signal modulations are performed to cause the signal transmission rate to be increased, problems such as signal interference, a change in amplitude of the transmission signal, and an increase in a PAPR value may occur. In particular, when the PAPR value increases, it causes a problem that distortion occur in an analog-to-digital converter (ADC), quantization, etc., thereby reducing the overall performance of the system.

SUMMARY OF THE INVENTION

It is an object of the present invention to provide an apparatus and method capable of realizing a low PAPR while simultaneously transmitting and receiving signals quickly and stably.

It is another object of the present invention to provide an apparatus and method capable of transmitting and receiving signals quickly and stably with simple components.

It is another object of the present invention to provide an apparatus and method for realizing a low PAPR and enhancing a security of transmission signals.

The technical objects to be achieved by the present disclosure are not limited to the technical matters mentioned above, and other technical subjects that are not mentioned are to be clearly understood by those skilled in the art from the following description.

According to an aspect of the present disclosure, a transmitter supporting for FTN (Faster-than-Nyquist) signaling may be provided. The transmitter includes a frame input unit providing an input frame obtained by composing a transmission signal in units of a frame; a sequence frame determination unit generating a plurality of scramble sequences, generating a plurality of sequence frames by applying the plurality of scramble sequences to the input frame, and determining at least one sequence frame from the plurality of sequence frames considering a PAPR value of the plurality of sequence frames; and a signal transmission unit for transmitting the sequence frame determined.

According to other aspect of the present disclosure, a receiver supporting for FTN (Faster-than-Nyquist) signaling may be provided. The receiver includes a scramble sequence identification unit identifying information on a scramble sequence applied to a sequence frame transmitted by a transmitter; a reconstruction frame identification unit detecting a reconstruction frame from the sequence frame considering the information on the scramble sequence; and a signal reconstruction unit combining the reconstruction frame to reconstruct a transmission signal.

According to still other aspect of the present disclosure, a transmission method for supporting FTN (Faster-than-Nyquist) signaling may be provided. The method includes providing an input frame obtained by composing a transmission signal in units of a frame; generating a plurality of scramble sequences, generating a plurality of sequence frames by applying the plurality of scramble sequences to the input frame, and determining at least one sequence frame from the plurality of sequence frames considering a PAPR value of the plurality of sequence frames; and transmitting the sequence frame determined.

According to still other aspect of the present disclosure, a receiving method for supporting FTN (Faster-than-Nyquist) signaling may be provided.

According to an embodiment of the present disclosure may be performed by the receiver according to an embodiment of the present disclosure described above. The method includes identifying information on scramble sequences applied to a sequence frame transmitted from a transmitter; detecting a reconstruction frame from the sequence frame considering the information on the scramble sequences; and combining the reconstruction frame to reconstruct a transmission signal.

The features briefly summarized above for this disclosure are only exemplary aspects of the detailed description of the disclosure which follows, and are not intended to limit the scope of the disclosure.

According to the present disclosure, it is possible to provide an apparatus and method capable of minimizing interference while transmitting the signal quickly, and at the same time realizing a low PAPR.

Furthermore, according to the present disclosure, it is possible to provide an apparatus and method capable of transmitting and receiving signals quickly and stably with a relatively simple configuration.

Further, according to the present disclosure, it is possible to provide an apparatus and method capable of realizing a low PAPR and enhancing the security of signals transmitted and received.

The effects obtainable in the present disclosure are not limited to the effects mentioned above, and other effects not mentioned can be clearly understood by those skilled in the art from the description described below.

BRIEF DESCRIPTION OF THE DRAWINGS

The above and other objects, features and other advantages of the present invention will be more clearly understood from the following detailed description when taken in conjunction with the accompanying drawings, in which:

FIG. 1 is a block diagram illustrating a configuration of a transmitter according to an embodiment of the present disclosure;

FIG. 2 is a block diagram illustrating a detailed configuration of a sequence frame determination unit equipped in a transmitter according to an embodiment of the present disclosure;

FIG. 3 is a block diagram illustrating a detailed configuration of a scramble sequence generation unit equipped in a transmitter according to an embodiment of the present disclosure;

FIGS. 4A and 4B are views illustrating a detailed configuration of the sequence generation unit of FIG. 3;

FIG. 5 is a block diagram illustrating a configuration of a receiver according to an embodiment of the present disclosure;

FIG. 6 is a flow diagram illustrating procedures in a method of transmitting a signal for supporting FTN signaling according to an embodiment of the present disclosure;

FIG. 7 is a detailed flowchart illustrating specific procedures in a transmission method according to an embodiment of the present disclosure; and FIG. 8 is a flow diagram illustrating operations in a receiving method according to an embodiment of the present disclosure.

DETAILED DESCRIPTION OF THE INVENTION

Hereinbelow, embodiments of the present invention will be described in detail so that those skilled in the art can easily carry out the present invention referring to the accompanying drawings. However, the present disclosure may be embodied in many different forms and is not limited to the embodiments described herein.

In the following description of the embodiments of the present invention, a detailed description of known functions and configurations incorporated herein will be omitted when it may make the subject matter of the present disclosure unclear. Parts not related to the description of the present disclosure in the drawings are omitted, and similar parts are denoted by similar reference numerals.

In the present disclosure, when an element is referred to as being "connected", "coupled", or "connected" to another element, it is understood to include not only a direct connection relationship but also an indirect connection relationship. Also, when an element is referred to as "containing" or "having" another element, it means not only excluding another element but also further including another element.

In the present disclosure, the terms first, second, and so on are used only for the purpose of distinguishing one element from another, and do not limit the order or importance of the elements unless specifically mentioned. Thus, within the scope of this disclosure, the first component in an embodiment may be referred to as a second component in another embodiment, and similarly a second component in an embodiment may be referred to as a second component in another embodiment.

In the present disclosure, components that are distinguished from one another are intended to clearly illustrate each feature and do not necessarily mean that components are separate. That is, a plurality of components may be integrated into one hardware or software unit, or a single component may be distributed into a plurality of hardware or software units. Accordingly, such integrated or distributed embodiments are also included within the scope of the present disclosure, unless otherwise noted.

In the present disclosure, the components described in the various embodiments do not necessarily mean essential components, but some may be optional components. Accordingly, embodiments consisting of a subset of the components described in an embodiment are also included within the scope of this disclosure. Also, embodiments that include other components in addition to the components described in the various embodiments are also included in the scope of the present disclosure.

Hereinafter, embodiments of the present disclosure will be described with reference to the accompanying drawings.

FIG. 1 is a block diagram illustrating a configuration of a transmitter according to an embodiment of the present disclosure.

Referring to FIG. 1, the transmitter according to an embodiment of the present disclosure includes a frame input unit 10, a sequence frame determination unit 20, and a signal transmission unit 30.

The frame input unit 10 modulates a transmission signal into a modulation symbol, and composes the modulated signal in units of a predetermined frame length. Such a signal composed in units of the predetermined frame length may be referred to as an input frame.

Further, the frame input unit 10 may modulate the transmission signal to form a modulation symbol based on schemes such as PSK, QAM, and the like.

The sequence frame determination unit 20 may generate a plurality of scramble sequences and generate a plurality of sequence frames by applying the plurality of scramble sequences to the input frame. The sequence frame determination unit 20 may identify a peak-to-average power ratio (PAPR) value of the plurality of sequence frames and identify at least one sequence frame having the smallest PAPR value among the plurality of sequence frames.

At least one sequence frame with the smallest PAPR value may be provided to the signal transmission unit 30, and the signal transmission unit 30 processes to transmit the at least one sequence frame.

Further, in transmitting the sequence frame, it is necessary to control a pulse shaping and a pulse transmission rate in order to transmit the signal without interference between a given bandwidth and the modulation symbol. The sequence frame determination unit 20 may transmit a sequence frame using a Nyquist rate in order to realize a maximum transmission rate in a given bandwidth without interference between the modulation symbols.

In particular, the sequence frame determination unit 20 may transmit a sequence frame based on a Faster-than-Nyquist (FTN) transmission scheme. When transmitting a signal using the FTN transmission scheme, there is an advantage in which a symbol transmission rate is increased without loss of bit error rate (BER) even if an Inter-Symbol Interference (ISI) occurs in the transmission signal. In view of this, the sequence frame determination unit 20 may include at least one FTN pulse generator. In addition, a plurality of sequence frames may be input into at least one FTN pulse generator, and the plurality of sequence frames may be transformed into signals based on the FTN scheme.

However, there is a problem that a high-complexity transceiver mast be designed in order to transmit a signal using an FTN transmission scheme without loss of BER performance. In addition, with the FTN transmission scheme, orthogonality between the symbols is not maintained, thereby causing interference between the symbols.

Such interference between symbols changes the amplitude of the transmission signal and furthermore affects the PAPR of the transmission signal. That is, when the PAPR of the transmission signal is high, it may cause a problem in which saturation occurs in procedures of processing an analog-to-digital converter, quantization, or the like, thereby degrading a performance of an apparatus of transmitting and receiving a signal.

Accordingly, the sequence frame determination unit 20 may cause the input frame provided in the frame input unit 10 to be transformed into a signal based on the FTN scheme and then the signal to be transmitted. The transmission signal is controlled to be stably transmitted in consideration of a PAPR of the transmission signal.

FIG. 2 is a block diagram illustrating a detailed configuration of a sequence frame determination unit equipped in a transmitter according to an embodiment of the present disclosure;

Referring to FIG. 2, the sequence frame determination unit 20 may include a scramble sequence generation unit 21, a scrambler 23, an FTN pulse generator 25, and a PAPR identification unit 27.

The scramble sequence generation unit 21 generates the plurality of scramble sequences corresponding to the length of the input frame, and the scrambler 23 scrambles the plurality of scramble sequences with the input frame. For example, the scramble sequence generation unit 21 may include sequence generators 31-1, 31-2, . . . , and 31-n (see FIG. 3) for generating scramble sequences. Each of the sequence generators 31-1, 31-2, . . . , and 31-n may generate different scramble sequences. The length of the scramble sequence generated in each of the sequence generators 31-1, 31-2, . . . , and 31-n may be set to a length corresponding to the length of the input frame.

Meanwhile, the scrambler 23 scrambles each scramble sequence output from the sequence generators 31-1, 31-2, . . . , and 31-n with the input frame. For example, the scrambler 23 may perform an operation of multiplying the input frame by each of scramble sequences output from the sequence generators 31-1, 31-2, . . . , and 31-n. Accordingly, the scrambler 23 may output as many scramble frames 35-1, 35-2, . . . , and 35 as the number of the sequence generators 31-1, 31-2, . . . , and 31-n.

FIGS. 4A and 4B are views illustrating a detailed configuration of the sequence generator of FIG. 3. FIG. 4A illustrates an example for a detailed configuration of the sequence generator having a single seed, and FIG. 4B illustrates an example for a detailed configuration of the sequence generator having multiple seeds.

First, referring to FIG. 4A, the sequence generator 40 may include a plurality of bit generators 41a, 41b, . . . , and 41r, a first adder 42, and a second adder 43. The bit generators 41a, 41b, . . . , and 41r may generate and output binary bits (0 or 1), respectively, and the first adder 42 and the second adder 43 combines bit values output from the bit generators 41a, 41b, . . . , and 41r to generate and output scramble sequence. When the sequence generator 40 includes 19 bit generators 41a, 41b, . . . , and 41r, the value output from the sequence generator 40 may be illustrated as Equation 1 below.

$$1+Y^5+Y^7+Y^{10}+Y^{18}$$ [Equation 1]

As an initial seed value is set differently in the sequence generator 40, a type of the generated scramble sequence may be differently output. When a total of S seeds are used, determined values of S scramble sequences having the length of K may be generated.

The determined value of the scramble sequence determined by the sequence generator 40 may be expressed by Equation 2 below.

$$R=[R^{(1)} R^{(2)} \ldots R^{(s)} \ldots R^{(S)}]$$ [Equation 2]

Furthermore, since the determined value of the scramble sequence generated by the sequence generator 40 is composed of binary bits (0 or 1), a scramble sequence transform unit 44 may be further included to transform the frame phase into the sequence. The scramble sequence transform unit 44 may compose output values of the scramble sequences to allow values included in the scramble sequences to correspond to a matching relationship shown in Table 1 below.

TABLE 1

| $R_k$ | $P_k$ |
|---|---|
| 0 | −1 |
| 1 | 1 |

$R_k$ represents a determined value of the scramble sequence, and $P_k$ represents an output value of the scramble sequence. In consideration thereof, an output value of the scramble sequence may be illustrated as Equation 3 below.

$$P=[P^{(1)} P^{(2)} \ldots P^{(s)} \ldots P^{(S)}]$$ [Equation 3]

In Equation 3, an output value of the S-th scramble sequence, $P^{(s)}$ may be expressed as Equation 4 below.

$$P^{(s)}=[P_1^{(s)} P_2^{(s)} \ldots P_k^{(s)} \ldots P_K^{(s)}], P_k^{(s)} \in \{+1, -1\}$$ [Equation 4]

Meanwhile, when two kinds of seeds are used to compose a scramble sequence, values of two kinds of seeds, that is, X and Y seeds may be set differently from each other, whereby various sequences may be generated.

For example, referring to FIG. 4B, a sequence generator 40' may include a plurality of X bit generators 45a, 45b, . . . , and 45q, a plurality of Y bit generators 46a, 46b, . . . , and 46q, first to sixth adders 47a, 47b, 47c, 47d, 47e, and 47f, and a 2 bit adder 48. The X bit generators 45a, 45b, . . . , and 45q, and the Y bit generators 46a, 46b, . . . , and 46q may generate and output a binary bit (0 or 1) respectively, and the first to sixth adders 47a, 47b, 47c, 47d, 47e, and 47f, and the 2 bit adder 48 combine the bit values output from the X bit generators 45a, 45b, . . . , and 45q and the Y bit generators 46a, 46b, . . . , and 46q to generate the determined values of the scramble sequences.

When the values of the X and Y seeds are set differently from each other to cause the resulting value of the scramble sequence to be calculated, the sequence generator 40' may compose the resulting value of the scramble sequence having 0, 1, 2, and 3.

Furthermore, the sequence generator 40' may further include a scramble sequence transform unit 49. The scramble sequence transform unit 49 may compose the output values of the scramble sequences so that values 0, 1, 2, and 3 included in the scramble sequence may correspond to a matching relationship shown in Table 2 below.

TABLE 2

| $R_k$ | $P_k$ |
|---|---|
| 0 | 1 |
| 1 | j |
| 2 | −1 |
| 3 | −j |

$R_k$ represents a determined value of the scramble sequence, and $P_k$ represents an output value of the scramble sequence.

The determined values 0, 1, 2, and 3 of the scramble sequence calculated by setting values of the X and Y seeds differently from each other are transformed into the output values 1, j, −1, −j of the scramble sequence respectively, and then provided to the scrambler 23, whereby the scrambler 23 may modulate the phase considering both real and complex numbers.

The output value $P^{(s)}$ of the scramble sequence generated through the above operation is provided to the scrambler 23, and the scrambler 23 may apply the output value $P^{(s)}$ of the scramble sequence to the input frame a, to compose and output scramble frames $a^{(s)}$. For example, the scrambler 23 may compose scrambled frames $a^{(s)}$ through an operation of Equation 5 below.

$$a^{(s)} = a \cdot P^{(s)}, 2 \leq s \leq S \qquad \text{[Equation 5]}$$

Meanwhile, the scrambler 23 may continuously perform the above-described operations for a plurality of input frames $a_k$ ($a_k$ is a k-th input frame). Accordingly, the scrambler 23 may output scramble frames $a_k^{(S)}$ for a plurality of input frames $a_k$.

The FTN pulse generator 25 may generate an FTN pulse for the scrambled frame $a_k^{(S)}$ through the same operation as Equation 6 below, and compose a sequence frame having such an FTN pulse.

$$x(t) = \Sigma_k a_k^{(s)} h(t - k\tau T) \qquad \text{[Equation 6]}$$

Wherein, $a_k^{(S)}$ denotes a scramble frame corresponding to a k-th input frame $a_k$, h(t) has a bandwidth of ½T and denotes a squared root raised cosine (SRRC) pulse having energy of $\int_{-\infty}^{\infty} |h(t)|^2 dt = 1$. In addition, $\tau$ (0<$\tau$<1) denotes an FTN factor, and T denotes the spacing of Nyquist symbols. Also, $\tau$T represents the symbol interval of the signal to which the FTN transmission scheme is applied, which is a Nyquist transmission period when $\tau$ is 1.

Although the FTN transmission scheme transmits a signal at a higher transmission rate than a Nyquist transmission period, interference between symbols in the transmission signal may be caused, in which the magnitude of such interference may be determined by a type of transmission pulse and a value of T. This interference changes the amplitude of the transmission signal, thereby affecting a PAPR of the transmission signal.

When the scramble frames $a_k^{(S)}$ pass through the FTN pulse generator 25 as described above, the sequence frames $x^{(s)}$ output from the FTN pulse generator 25 may be represented as Equation 7 below.

$$x^{(S)} = [x^{(S)}(1) x^{(S)}(2) \ldots x^{(S)}(k) \ldots x^{(S)}(K)] \qquad \text{[Equation 7]}$$

Meanwhile, a PAPR is a ratio of a peak power to an average power which is a criterion indicating an influence of the transmission signal on a transceiver, and may be expressed as Equation 8 below.

$$PAPR = [PAPR_1, PAPR_2 \ldots PAPR_s \ldots PAPR_s] \qquad \text{[Equation 8]}$$

$$PAPR_s = \frac{\max|x^{(s)}|^2}{E[|x^{(s)}|^2]}$$

From the above equation, $\max|x^{(s)}|^2$ denotes a power of a peak signal of the sequence frames $x^{(s)}$, and $E[|x^{(s)}|^2]$ denotes a mean power of the sequence frames $x^{(s)}$.

The value of PAPR may be calculated as a dB scale value and represents the power difference between the average power of the sequence frames $x^{(s)}$ and the peak signal.

The signal transmission performance may be identified using the PAPR value calculated above. For example, the PAPR identification unit 27 may determine a sequence frame having the smallest PAPR value among the sequence frames $x^{(s)}$ and then transmit the corresponding sequence frame to the signal transmission unit 30.

As another example, the PAPR identification unit 27 may identify signal transmission performance $F_x(X^{(S)})$ by calculating a complementary cumulative distribution function (CCDF) illustrated in Equation 9 below.

$$F_x(x^{(S)}) = Pr[X^{(S)} > x_{Th}] \qquad \text{[Equation 9]}$$

In Equation 4, $X^{(S)}$ indicates a PAPR for the sequence frame and $x_{Th}$ indicates a threshold for the PAPR. $Pr[X^{(S)} > x_{Th}]$ means a probability that the PAPR value $X^{(S)}$ for the sequence frame will be larger than the predetermined threshold value $X^{Th}$. The PAPR identification unit 27 compares transmission performance $F_x(X^{(S)})$ of the signal identified with respect to the sequence frames $x^{(S)}$ with each other to determine a sequence frame having a relatively large value and thus transmits the corresponding sequence frame to the signal transmission unit 30.

Meanwhile, the signal transmission unit 30 may transmit the corresponding sequence frame to a receiver. At this time, the signal transmission unit 30 may transmit information on the scramble sequence applied to the corresponding sequence frame to the receiver.

In order to transmit the information on the scramble sequence applied to the corresponding sequence frame to the receiver, the transmitter and the receiver must be equipped to transmit and receive information on the scramble sequence. Therefore, only the receiver provided to receive information on the scramble sequence may identify the information on the scramble sequence, and decode the received signal using the information on the scramble sequence. As a result, the transmitter and the receiver according to the embodiment of the present disclosure are enabled to transmit and receive signals having a low PAPR and at the same time to enhance security of signals transmitted and received.

FIG. 5 is a block diagram illustrating a configuration of a receiver according to an embodiment of the present disclosure.

Referring to FIG. 5, the receiver according to an embodiment of the present disclosure may include a scramble sequence information identification unit 51, a reconstruction frame identification unit 53, and a signal reconstruction unit 55.

The scramble sequence information identification unit 51 may detect scramble sequence information, that is, information on the scramble sequence applied to the received frame, from the received signal. For example, the scramble sequence information may include information indicating a scramble sequence value or a method of generating the scramble sequence value.

The reconstruction frame identification unit 53 may detect the reconstruction frame from the received frame using the scramble sequence information. For example, the reconstruction frame identification unit 53 may include a scramble sequence generation unit 53a and a descrambler 53b. The scramble sequence generation unit 53a may generate the scramble sequence value using the scramble sequence information and provide the scramble sequence value to the descrambler 53b. The descrambler 53b may process an operation of dividing the received frame into the scramble sequence value and then detect the processed result as a reconstruction frame.

On the other hand, when the scramble sequence information includes information indicating how to generate the scramble sequence value, the scramble sequence generation unit 53a may generate a plurality of scramble sequences based on a method of generating the scramble sequence value. The scramble sequence generation unit 53a may provide the plurality of scramble sequences to the descrambler 53b. The descrambler 53b generates a plurality of temporary reconstruction frames by applying the plurality of scramble sequences to the received frame respectively, whereby at least one frame may be determined from the plurality of temporary reconstruction frames as a reconstruction frame, based on a predetermined method.

In addition, when a transmitter generates a transmission frame based on an FTN scheme, the reconstruction frame identification unit 53 may further include an FTN inverse-transform unit 53c for performing inverse filtering on the received frame based on the FTN scheme. Consequently, the received frame is subject to inverse filtering based on the FTN scheme through the FTN inverse transform unit 53c, and then is provided to the descrambler 53b.

On the other hand, the signal reconstruction unit 55 may compose a reconstruction signal by connecting reconstruction frames divided into a predetermined length unit and demodulating the connected frame signal. At this time, a method of demodulating a signal may be applied to correspond to a method of modulating a signal in the above-mentioned transmitter.

FIG. 6 is a flow diagram illustrating procedures in a method of transmitting a signal for supporting FTN signaling according to an embodiment of the present disclosure;

A method of transmitting a signal for supporting FTN signaling according to an embodiment of the present disclosure may be performed by a transmitter according to an embodiment of the present disclosure described above.

First, in step S610, the transmitter modulates a transmission signal into a modulation symbol, and composes the modulated signal in units of a predetermined frame length. Such a signal composed in units of the predetermined frame length may be referred to as an input frame.

The transmitter may compose the modulation symbol by modulating the transmission signal based on a scheme, such as Phase Shift Keying (PSK), Quadrature Amplitude Modulation (QAM), and the like.

In step S620, the transmitter may generate a plurality of scramble sequences and generate a plurality of sequence frames by applying the plurality of scramble sequences to the input frame. The transmitter may identify a peak-to-average power ratio (PAPR) value of the plurality of sequence frames and identify at least one sequence frame having a relatively small PAPR value among the plurality of sequence frames.

In step S630, the transmitter may process to transmit at least one sequence frame having a relatively small PAPR value.

Further, in transmitting the sequence frame, it is necessary to control a pulse shaping and a pulse transmission rate in order to transmit the signal without interference between a given bandwidth and a modulation symbol. The transmitter may transmit a sequence frame using a Nyquist rate in order to implement a maximum transmission rate in a given bandwidth without interference between modulation symbols. In particular, the transmitter may transmit a sequence frame based on a Faster-than-Nyquist (FTN) transmission scheme. Furthermore, when transmitting signals using the FTN transmission scheme, orthogonality between symbols may not be maintained, resulting in interference between symbols. Such interference between symbols affects a PAPR of the transmission signal, thereby causing a problem of degrading signal transmission performance.

Accordingly, when the transmitter transforms the input frame into a signal based on the FTN scheme and then transmits the transmission signal, the transmitter may control to transmit the transmission signal considering a PAPR of the transmission signal in order to transmit the transmission signal stably.

FIG. 7 is a detailed flowchart illustrating specific procedures in a transmission method according to an embodiment of the present disclosure; and Particularly, FIG. 7 illustrates, in detail, the step S620 of composing the sequence frame in FIG. 6 described above.

In step S721, the transmitter may generate the plurality of scramble sequences corresponding to the length of the input frame.

For example, the transmitter may generate different scramble sequences. The length of each scramble sequence may be set to correspond to the length of the input frame.

Specifically, the transmitter may use a plurality of bit generators to generate S binary bits (0 or 1) corresponding to the length of the input frame. Accordingly, the transmitter may generate and output as many different scramble sequences as the number of $2^S$.

The transmitter may be output different kinds of scramble sequences generated according to settings of an initial seed value. When a total of S seeds are used, the determined values of S scramble sequences having the length of K may be generated.

The determined value of the scramble sequence determined by the transmitter may be expressed as Equation 2 above. Further, the determined value of the scramble sequence may be composed with binary bits (0 or 1), and be required to be modified to vary the phase of the input frame. Therefore, the transmitter may transform the bit value contained in the determined value of the scramble sequence into an output value of the scramble sequence in accordance with the matching relationship of Table 1 described above, in which the output value of the scramble sequence may be represented as Equations 3 and 4.

On the other hand, when two kinds of seeds are used to compose a scramble sequence, the values of two kinds of seeds, that is, X and Y seeds may be set differently from each other, whereby various sequences may be generated.

When the values of the X and Y seed are set differently from each other so that the resulting value of the scramble sequence is calculated, the transmitter may construct the resulting value of the scramble sequence having 0, 1, 2, and 3. Then, the transmitter may transform the values (0, 1, 2, 3) included in the scramble sequence into the output value of the scramble sequence in accordance with the matching relationship shown in Table 2 described above. The determined values (0, 1, 2, 3) of the scramble sequence calculated by setting values of the X and Y seeds differently from each other are transformed into output values (1, j, −1, −j) of the scramble sequence and then provided to the scrambler 23, whereby the scrambler 23 may modulate the phase considering both real and complex numbers.

On the other hand, in step S722, the transmitter scrambles each scramble sequence with the input frame. For example, the transmitter may perform an operation of multiplying the input frame by each scramble sequence. Consequently, the transmitter may output as many scramble frames as the number of scramble sequences.

That is, the transmitter may compose the scramble frame $a^{(S)}$ by applying the output value $P^{(S)}$ of the scramble sequence provided via step S721 to the input frame a. The scramble frame $a^{(S)}$ may be composed through the operation of Equation 5 described above.

In step S722, the transmitter may continuously perform the above-described operations for a plurality of input frames $a_k$ ($a_k$ are k-th input frames). Accordingly, the transmitter may output scramble frames $a_k^{(S)}$ for a plurality of input frames $a_k$.

In step S723, the transmitter may generate pulse based on the FTN scheme for the scramble frames $a_k^{(S)}$. To generate the pulse based on the FTN scheme may be performed through the operation of Equation 6 described above. The pulse (i.e., sequence frame) generated for the scramble frame $a_k^{(S)}$ based on the FTN scheme may be expressed as Equation 7 described above.

With the FTN transmission scheme, the signal may be transmitted at a higher transmission rate than a Nyquist transmission period, but cause interference between symbols in the transmission signal, in which the magnitude of such interference may be determined by a type of transmission pulse and a value of τ. This interference changes the amplitude of the transmission signal, which affects the PAPR of the transmission signal.

The PAPR means a ratio of the peak power to the average power, which is a criterion indicating an influence of the transmission signal on the transceiver, and may be confirmed via calculation of Equation 8 described above. The value of PAPR may be calculated as a dB scale value, and represents a power difference between an average power of the transmission frames $x^{(S)}$ and a peak signal.

In consideration of this, in step S724, the transmitter may identify a PAPR value for each of a plurality of transmission frames provided in step S723, and identify a signal transmission performance using the PAPR value. For example, the transmitter may determine a sequence frame having the smallest PAPR value among the sequence frames $x^{(S)}$.

As another example, the transmitter may identify signal transmission performance $F_x(X^{(S)})$ by calculating complementary cumulative distribution function CCDF illustrated in Equation 9 disclosed above. That is, the transmitter may determine a sequence frame having a relatively large value by comparing the signal transmission performance $F_x(X^{(S)})$ identified for the sequence frames $x^{(S)}$ with each other.

Meanwhiles, in step S630, the transmitter may transmit the determined sequence frame to the receiver. In this case, the transmitter may transmit information on the scramble sequence applied to the corresponding sequence frame to the receiver.

In order to transmit the information on the scramble sequence applied to the corresponding sequence frame to the receiver, the transmitter and the receiver must be equipped to transmit and receive information on the scramble sequence. Therefore, only the receiver provided to receive information on the scramble sequence may identify the information on the scramble sequence, and may decode the received signal using the information on the scramble sequence. As a result, the transmitter and the receiver according to the embodiment of the present disclosure are enabled to transmit and receive signals having a low PAPR and at the same time to enhance security of signals transmitted and received.

FIG. 8 is a flow diagram illustrating operations in a receiving method according to an embodiment of the present disclosure.

A receiving method according to an embodiment of the present disclosure may be performed by the receiver according to an embodiment of the present disclosure described above.

First, in step S810, the receiver may detect scramble sequence information, that is, information on a scramble sequence applied to a received frame, from the received signal. For example, the scramble sequence information may include information indicating a scramble sequence value or a method of generating the scramble sequence value.

In step S820, the receiver may detect a reconstruction frame from the received frame using the scramble sequence information identified in step S810. For example, the receiver may generate the scramble sequence value using scramble sequence information, process an operation of dividing the received frame by the scramble sequence value, and detect the processed result as a reconstruction frame.

Meanwhile, when the information on the scramble sequence includes information indicating a method of generating the value of the scramble sequence, the receiver may generate a plurality of scramble sequences based on a method of generating the scramble sequence. In addition, the receiver may generate a plurality of temporary reconstruction frames by applying the plurality of scramble sequences to the received frame and determine at least one frame among the plurality of temporary reconstruction frames as a reconstruction frame, based on a predetermined method.

Furthermore, when the transmitter generates the transmission frame based on the FTN scheme, the receiver may perform an inverse filtering on the received frame based on the FTN scheme. After completing the inverse filtering based on the FTN scheme, it is possible to detect the reconstruction frame using the scramble sequence value.

Meanwhile, in step S830, the receiver may compose reconstruction signals by connecting reconstruction frames divided into a predetermined length unit and demodulating the connected frame signals. At this time, a method of demodulating a signal may be correspondingly applied to a method (e.g., PSK, QAM, etc.) of modulating a signal in the transmitter described above.

Although the exemplary methods of this disclosure are represented by a series of steps for clarity of explanation, they are not intended to limit the order in which the steps are performed, and if necessary, each step may be performed simultaneously or in a different order. In order to implement the method according to the present disclosure, it is possible to include other steps to the illustrative steps additionally, exclude some steps and include remaining steps, or exclude some steps and include additional steps.

The various embodiments of the disclosure are not intended to be exhaustive of all possible combination, but rather to illustrate representative aspects of the disclosure, and the features described in the various embodiments may be applied independently or in a combination of two or more.

In addition, various embodiments of the present disclosure may be implemented by hardware, firmware, software, or a combination thereof. A case of hardware implementation may be performed by one or more application specific integrated circuits ASICs, digital signal processors DSPs, digital signal processing devices DSPDs, programmable logic devices PLDs, field programmable gate arrays FPGAs, a general processor, a controller, a microcontroller, a microprocessor, and the like.

The scope of the present disclosure is to encompass software or machine-executable instructions (e.g., operating system, applications, firmware, instructions, and the like) by which operations according to method of various embodiments are executed on a device or a computer, and non-transitory computer-readable media executable on the device or the computer, on which such software or instructions are stored.

The invention claimed is:

1. A transmitter comprising:
one or more processors configured to:
generate an input frame by composing a transmission signal in units of a frame;
generate a plurality of scramble sequences,
generate a plurality of sequence frames by applying the plurality of scramble sequences to the input frame, and
identify at least one sequence frame from the plurality of sequence frames based on a peak-to-average power ratio (PAPR) value of the plurality of sequence frames; and
a signal transmitter configured to transmit the identified sequence frame,
wherein the plurality of scramble sequences are generated to correspond to a length of the input frame, and the plurality of scramble sequences are scrambled with the input frame.

2. The transmitter of claim 1, wherein the one or more processors are further configured to identify a PAPR value for each of the plurality of sequence frames, and determine the at least one sequence frame which has a lowest PAPR value among the plurality of sequence frames.

3. The transmitter of claim 1, further including
a transmission filter configured to receive the plurality of scrambled sequence frames and generate a pulse to transmit the plurality of sequence frames.

4. The transmitter of claim 3, wherein the transmission filter includes a faster-than-Nyquist (FTN) pulse generator configured to generate a transmission pulse based on a FTN scheme.

5. The transmitter of claim 1, further including
a sequence generator set including a plurality of sequence generators configured to output determined values of the scramble sequences obtained by sequentially arranging values output from the plurality of sequence generators; and
wherein the one or more processors are further configured to transform the determined values of the scramble sequences into output values of the scramble sequences through mapping based on a predetermined rule.

6. The transmitter of claim 5, wherein the one or more processors are further configured to transform a value of '0' output from the sequence generator set into '−1', and transform a value of '1' output from the plurality of sequence generators into '1'.

7. The transmitter of claim 1, wherein the transmitter includes:
a plurality of sequence generator sets including a plurality of sequence generators, and the sequence generator sets are configured to output determined values of the scramble sequences obtained by sequentially arranging values output from the plurality of sequence generators; and
the one or more processors are further configured to
add values output from the plurality of sequence generator sets; and
transform the determined values of the scramble sequences into output values of the scramble sequences through mapping based on a predetermined rule.

8. The transmitter of claim 7, wherein the one or more processors are further configured to transform a value of '0' output from the adder into '1', transform a value of '1' output from the adder into 'j', transform a value of '2' output from the adder into '−1', and transform a value of '3' output from the adder into '−j'.

9. The transmitter of claim 1, wherein each of the plurality of scramble sequences has a unique value.

10. A receiver comprising:
one or more processors configured to:
identify information on a scramble sequence applied to a sequence frame transmitted by a transmitter;
detect a reconstruction frame from the sequence frame based on the identified information on the scramble sequence; and
combine the detected reconstruction frame to reconstruct a transmission signal,
wherein the one or more processors are further configured to:
generate a scramble sequence value using the identified information on the scramble sequence,
divide the received frame into the scramble sequence value, and
detect a result of the dividing of the received frame as the reconstruction frame.

11. A transmission method comprising:
generating an input frame by composing a transmission signal in units of a frame;
generating a plurality of scramble sequences;
generating a plurality of sequence frames by applying the plurality of scramble sequences to the input frame; and
identifying at least one sequence frame from the plurality of sequence frames based on a peak-to-average power ratio (PAPR) value of the plurality of sequence frames; and
transmitting the identified sequence frame
wherein the identifying at least one sequence frame comprises:
generating the plurality of scramble sequences corresponding to a length of the input frame; and
scrambling the plurality of scramble sequences with the input frame.

12. The method of claim 11, wherein the determining at least one sequence frame comprises:
identifying a PAPR value for each of the plurality of sequence frames; and
determining the at least one sequence frame which has a lowest PAPR value among the plurality of sequence frames.

13. The method of claim 11, wherein the determining at least one sequence frame further comprises:
receiving the plurality of scrambled sequence frames, and generating a pulse to transmit the plurality of sequence frames.

14. The method of claim 13, wherein the pulse to transmit the plurality of sequence frames is generated based on a Faster-than-Nyquist (FTN) scheme.

15. The method of claim 11, wherein the generating the plurality of scramble sequences comprises:
generating determined values of the scramble sequences obtained by sequentially arranging a plurality of sequence values; and
transforming the determined values of the scramble sequences into output values of the scramble sequences through mapping based on a predetermined rule.

16. The method of claim 15, wherein the transforming the determined values of the scramble sequences into the output values of the scramble sequences is performed by transforming a sequence value of '0' into '−1', and transforming a sequence value of '1' into '1'.

17. The method of claim 11, wherein the generating the plurality of scramble sequences comprises:

generating determined values of the scramble sequences obtained by sequentially arranging a plurality of sequence values;

performing an add operation of adding the determined value of at least one scramble sequence; and transforming the determined values of the scramble sequences obtained via the add operation into output values of the scramble sequences through mapping based on a predetermined rule.

18. The method of claim 17, wherein the transforming the determined value of the scramble sequence into the output value of the scramble sequence is performed by transforming a value of '0' into '1', a value of '1' into T, a value of '2' into '−1', and a value of '3' into '−j', in the determined values of scramble sequences obtained via the add operation.

* * * * *